(12) United States Patent
Lavoie et al.

(10) Patent No.: US 8,614,106 B2
(45) Date of Patent: Dec. 24, 2013

(54) LINER-FREE TUNGSTEN CONTACT

(75) Inventors: Christian Lavoie, Pleasantville, NY (US); Ahmet S. Ozcan, Pleasantville, NY (US); Filippos Papadatos, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/299,573

(22) Filed: Nov. 18, 2011

(65) Prior Publication Data

US 2013/0127058 A1    May 23, 2013

(51) Int. Cl.
*H01L 23/48* (2006.01)

(52) U.S. Cl.
USPC .............. 438/15; 257/751; 257/769; 257/382; 257/E21.476; 257/E21.582

(58) Field of Classification Search
USPC .......... 257/751, 769, 382, E21.476, E23.157, 257/E21.582
See application file for complete search history.

(56) References Cited

U.S. PATENT DOCUMENTS

| | | | |
|---|---|---|---|
| 4,648,175 A | 3/1987 | Metz, Jr. et al. | |
| 5,500,249 A | 3/1996 | Telford et al. | |
| 5,838,051 A | 11/1998 | Yen et al. | |
| 6,372,566 B1 | 4/2002 | Kittl et al. | |
| 7,256,125 B2 | 8/2007 | Yamada et al. | |
| 7,279,430 B2 | 10/2007 | Chang et al. | |
| 7,338,871 B2 | 3/2008 | Lee et al. | |
| 7,781,316 B2 | 8/2010 | Lin et al. | |
| 2009/0163025 A1* | 6/2009 | Humayun et al. | 438/675 |
| 2009/0305131 A1* | 12/2009 | Kumar et al. | 429/206 |
| 2010/0052166 A1 | 3/2010 | Mukherjee et al. | |
| 2012/0119302 A1* | 5/2012 | Pei et al. | 257/382 |
| 2012/0181697 A1* | 7/2012 | Lavoie et al. | 257/769 |

OTHER PUBLICATIONS

E. K. Broadbent, "Nucleation and growth of chemically vapor deposited tungsten on various substrate materials: A review." J. Vac. Sci. Technol. B, vol. 5, No. 6, Nov./Dec. 1987, pp. 1661-1666.
U.S. Appl. No. 12/944,018 entitled "Trench Silicide Contact with Low Interface Resistance" filed Nov. 11, 2010.

* cited by examiner

*Primary Examiner* — Benjamin Sandvik
*Assistant Examiner* — Rodolfo Fortich
(74) *Attorney, Agent, or Firm* — Isaac J. Gooshaw; Jason H. Sosa

(57) ABSTRACT

A liner-less tungsten contact is formed on a nickel-tungsten silicide with a tungsten rich surface. A tungsten-containing layer is formed using tungsten-containing fluorine-free precursors. The tungsten-containing layer may act as a glue layer for a subsequent nucleation layer or as the nucleation layer. The tungsten plug is formed by standard processes. The result is a liner-less tungsten contact with low resistivity.

15 Claims, 4 Drawing Sheets

LINER-FREE TUNGSTEN CONTACT

FIELD OF THE INVENTION

This disclosure relates generally to semiconductor devices and more specifically to the formation of tungsten contacts for electrical connection to semiconductor devices.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Field-effect transistors (FETs), such as metal-oxide-semiconductor FETs (MOSFETs), are a commonly used semiconductor device. Generally, a FET has three terminals, i.e., a gate structure (or gate stack), a source region, and a drain region. In some instances, the body of the semiconductor may be considered a fourth terminal. The gate stack is a structure used to control output current, i.e., flow of carriers in the channel portion of a FET, through electrical or magnetic fields. The channel portion of the substrate is the region between the source region and the drain region of a semiconductor device that becomes conductive when the semiconductor device is turned on. The source region is a doped region in the semiconductor device from which majority carriers are flowing into the channel portion. The drain region is a doped region in the semiconductor device located at the end of the channel portion, in which carriers are flowing into from the source region via the channel portion and out of the semiconductor device through the drain region. A conductive plug, or contact, is electrically coupled to each terminal. One contact is made to the source region, one contact is made to the drain region, and one contact is made to the gate stack.

Metallic tungsten (W) is the primary conductor for contacts. As semiconductor nodes are scaled down, the transistors and contacts become increasingly smaller and the electrical resistance may increase to unacceptable levels. To reduce contact resistance, silicides (silicon metal alloys) are often formed on the semiconductor substrate between a doped region, such as the source or drain, and the contact.

A typical contact is comprised of the liner layer (Ti/TiN) and the W metal. The Ti film is deposited by physical vapor deposition (PVD) and the thin TiN by atomic layer deposition (ALD). The W layer is formed in two steps. In the first step, a thin nucleation layer is formed with the reduction of tungsten hexafluoride ($WF_6$) by either silane ($SiH_4$) or diborine ($B_2H_6$). In the second step the bulk of W is deposited with the reduction of $WF_6$ by hydrogen in a chemical vapor deposition (CVD) environment. Fluorine (F), which is formed as a byproduct during the W deposition, can violently react with the Ti and Si underneath and form defects known as "volcanoes". These defects when created will prohibit the flow of current and irreversibly damage the contact. The TiN layer prevents F from reaching and reacting with the underlying layers.

Various issues arise with depositing and using Ti/TiN films. These films, especially as semiconductor devices are scaled down, can significantly contribute to contact resistance. In addition, as the TiN barrier is thinned to meet the scalability requirements, its barrier properties are degraded and the underlying Ti and/or the silicide/doped region may be exposed to fluorine.

SUMMARY

One aspect of an embodiment of the present invention discloses a method for forming a liner-free tungsten contact. The method comprises providing a semiconductor substrate and a dielectric layer overlying the semiconductor substrate. The method further comprises etching an opening through the dielectric layer to expose a conductive region. The method further comprises forming a silicide over the conductive region using at least nickel and tungsten. The method further comprises depositing a nucleation layer on a sidewall of the opening and over the silicide, wherein the nucleation layer is at least partially comprised of tungsten and is formed using fluorine-free precursor chemistry, not $WF_6$. Subsequently, the method comprises filling the opening with tungsten to form the contact.

Another aspect of an embodiment of the present invention discloses an electrical structure. The electrical structure comprises a dielectric layer present on a semiconductor substrate. A contact opening is present through the dielectric layer. A nickel-tungsten alloy silicide is formed over the semiconductor substrate within the contact opening. A tungsten-containing nucleation layer formed within the contact opening covers the nickel-tungsten alloy silicide and at least a portion of a sidewall of the contact opening. A tungsten contact is formed within the contact opening and separated from the nickel-tungsten alloy silicide and at least a portion of the sidewall by the tungsten-containing nucleation layer.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
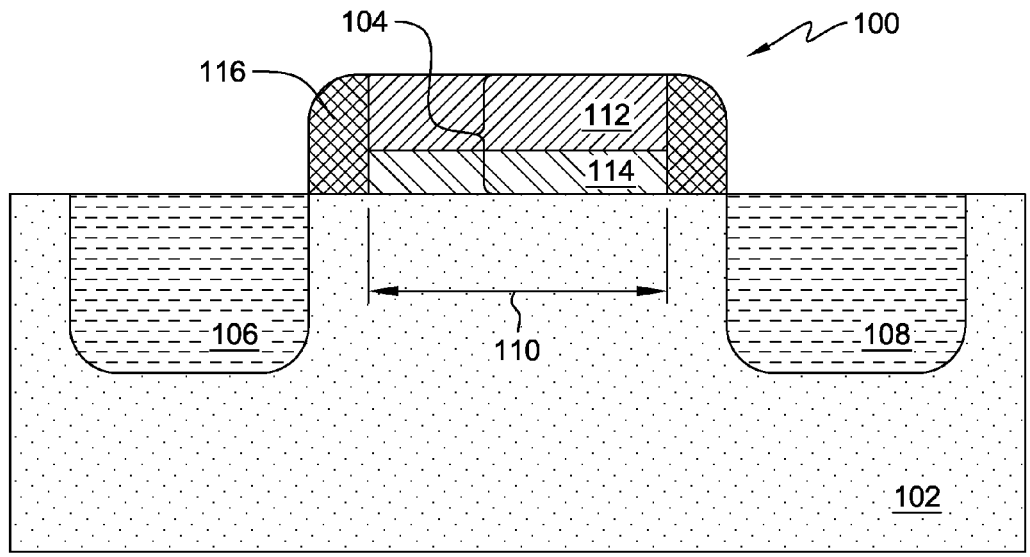
FIG. 1 depicts an exemplary semiconductor device to which a liner-free tungsten contact may be formed.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on", "positioned on" or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating or semiconductor layers at the interface of the two elements.

FIG. 1 depicts an exemplary semiconductor device to which a liner-free tungsten contact may be formed. Although the present disclosure provides details concerning forming the contact structures to the source region and the drain regions of field effect transistor (FET) 100 (the exemplary semiconductor device), the process disclosed herein may provide electrical contact to any device including, but not limited to, memory devices, resistors, diodes, capacitors, and other semiconductor devices, such as finFETs, Schottky barrier MOSFETS, and bipolar junction transistors.

FET 100 is formed on and within semiconductor substrate 102. Semiconductor substrate 102 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 102 may also be composed of other semiconductor materials, such as germanium, and compound semiconductor substrates, such as type III/V semiconductor substrates, e.g., GaAs. Although semiconductor substrate 102 is depicted as a bulk semiconductor substrate, semiconductor on insulator (SOI) substrate arrangements, such as silicon on insulator substrates, are also suitable for semiconductor substrate 102.

FET 100 has three terminals, i.e., gate stack 104, source region 106 and drain region 108. Gate stack 104 is a structure used to control output current, i.e., flow of carriers in channel 110, through electrical or magnetic fields. Channel 110 is the region between source region 106 and drain region 108 that becomes conductive when FET 100 is turned on. Source region 106, is a doped region in the transistor, from which majority carriers are flowing into the channel 110. Drain region 108 is a doped region in the transistor located at the end of channel 110, in which carriers are flowing into from source region 106 via channel 110, and out of FET 100. In an alternative embodiment, source region 106 and drain region 108 may be "raised" source/drain regions wherein a portion of the respective source/drain region is formed through epitaxial growth of semiconductor material embedded in semiconductor substrate 102. The respective source/drain regions can then rise out of semiconductor substrate 102 while another portion of the respective source/drain regions resides within semiconductor substrate 102.

Gate stack 104 includes at least a gate conductor 112 atop a gate dielectric 114. Gate conductor 112 may be a metal gate electrode. Gate conductor 112 may be composed of any conductive metal including, but not limited to, W, Ni, Ti, Mo, Ta, Cu, Pt, Ag, Au, Ru, Ir, Rh, and Re, and alloys that include at least one of the aforementioned conductive elemental metals. In another embodiment, gate conductor 112 may also be composed of a doped semiconductor material, such as n-type doped polysilicon.

Although not depicted in FIG. 1, gate conductor 112 may be a multi-layered structure. For example, gate conductor 112 may include a second conductive material atop a metal gate electrode. In one example, the second conductive material may be a doped semiconductor material, such as a doped silicon containing material, e.g., n-type doped polysilicon. When a combination of conductive elements is employed, an optional diffusion barrier material such as TaN or WN may be formed between the conductive materials.

Gate conductor 112 of gate stack 104 is typically present on a gate dielectric 114. Gate dielectric 114 may be a dielectric material, such as $SiO_2$, or alternatively a high-k dielectric, such as oxides of Hf, Ta, Zr, Al or combinations thereof. In another embodiment, gate dielectric 114 is comprised of an oxide, such as $ZrO_2$, $Ta_2O_5$ or $Al_2O_3$. In one embodiment, gate dielectric 114 has a thickness ranging from 1 nm to 10 nm. In another embodiment, the gate dielectric 114 has a thickness ranging from 1.0 nm to 2.0 nm.

A spacer 116 may be in direct contact with the sidewalls of gate stack 104. Spacer 116 typically has a width ranging from 2.0 nm to 15.0 nm, as measured from the sidewall of gate stack 104. Spacer 116 may be composed of a dielectric, such as a nitride, oxide, oxynitride, or a combination thereof.

Gate dielectric 114 and gate conductor 112 of gate stack 104 are present over channel 110. Source region 106 and drain region 108 are on opposing sides of channel 110. The conductivity-type of source region 106 and drain region 108 determines the conductivity of FET 100. Conductivity-type denotes whether source region 106 and drain region 108 have been doped with a p-type or n-type dopant. N-type dopant in a silicon containing material includes type V elements from the Periodic Table of Elements, such as phosphorus and arsenic. P-type dopant in a silicon containing material includes type III elements from the Periodic Table of Elements, such as boron.

Each of source region 106 and drain region 108 may include an extension dopant region (not shown) and a deep dopant region. The deep dopant region is usually formed either through implantation or epitaxial growth wherein the source and drain regions are doped in situ during formation.

Although only one semiconductor device (FET 100) is shown on substrate 102, any number of semiconductor devices may be formed on substrate 102 in various embodiments. Where multiple devices exist, device regions are preferably separated via dielectric trench isolation (not shown). This prevents electrical current leakage between adjacent semiconductor device components. In various embodiments, isolation regions may be at varying depths to form embodiments of shallow trench isolation or deep trench isolation.

Figure 2:
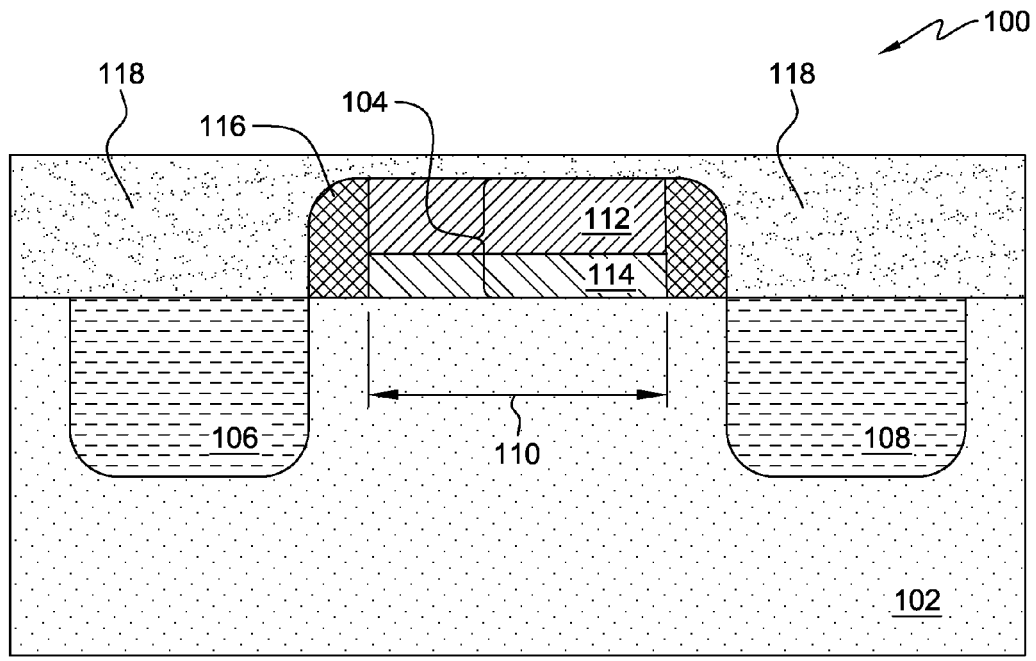
FIG. 2 depicts a dielectric layer formed on an upper surface of a substrate for the semiconductor device of FIG. 1.

FIG. 2 depicts dielectric layer 118 formed on the upper surface of substrate 102. Dielectric layer 118 may be composed of any dielectric material including, but not limited to, oxides, nitrides, oxynitrides, and combinations thereof. In one example, dielectric layer 118 may be composed of a silicon nitride film. In another example, dielectric layer 118 is composed of a silicon oxide film. In yet another example, dielectric layer 118 comprises a film stack consisting of a silicon nitride film and a silicon oxide film.

Figure 3:
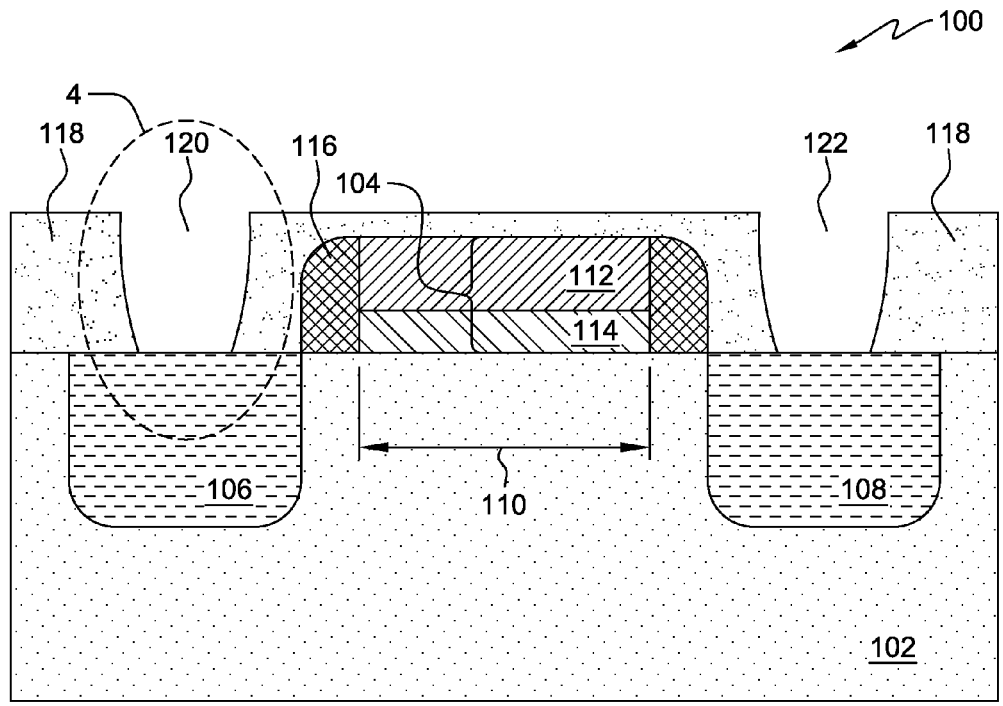
FIG. 3 depicts the dielectric layer of FIG. 2 etched to form contact holes exposing conductive regions the substrate.

As depicted in FIG. 3, dielectric layer 118 is etched to form contact holes (e.g., contact holes 120 and 122) through dielectric layer 118 to expose conductive regions (e.g., source region 106 and drain region 108) of semiconductor substrate 102. A person having ordinary skill in the art will recognize that in various embodiments, a contact "hole" may be a circular opening or a trench extending for a length on the semiconductor substrate 102.

Figure 4:
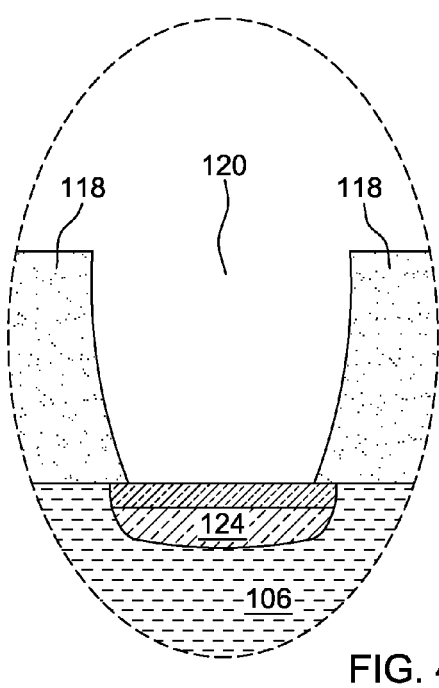
FIG. 4 depicts the formation of a silicide within a contact hole of FIG. 3, in accordance with an embodiment of the present invention.

FIG. 4 depicts a subsection of FET 100 to illustrate the formation of silicide 124 within contact hole 120, in accordance with an embodiment of the present invention.

A silicide structure is created through thermal diffusion that is induced by annealing metal and semiconductor containing materials that are in contact to produce a homogenous mixture or solid solution. In the depicted example, a metal containing layer is deposited on source region 106 at the bottom of contact hole 120. During the annealing process, metal elements from the metal containing layer diffuse and react with Si in source region 106 to form silicide 124. A person of ordinary skill in the art will recognize that forming silicide 124 within contact hole 120 is only one potential implementation and that in an alternative embodiment, silicide 124 is formed over source region 106 prior to the deposition of dielectric layer 118 and contact hole 120 is subsequently etched into dielectric layer 118 selective to silicide 124.

The metal containing layer may be deposited using physical vapor deposition (PVD) methods or chemical vapor deposition (CVD) methods. Examples of physical vapor deposition (PVD) techniques that are suitable for forming the metal containing layer include sputtering and plating. As used herein, "sputtering" means a method of depositing a film of material on a semiconductor surface. A target of the desired material, i.e., source region 106, is bombarded with particles, e.g., ions, which knock atoms from the target, and the dislodged target material deposits on the semiconductor surface. Examples of sputtering apparatuses include DC diode type systems, radio frequency (RF) sputtering, magnetron sputtering, and ionized metal plasma (IMP) sputtering. In one embodiment, the metal containing layer is a conformal layer. The term "conformal layer" denotes a layer having a thickness that does not deviate by more than 20% of an average value for the thickness of the layer. In another embodiment, the metal containing layer is non-conformal (e.g., applied using a non-conformal technique such as RF PVD, IMP PVD) where the goal is to deposit as little material as possible on the sidewalls of contact hole 120.

In the preferred embodiment, the metal containing layer is composed of a nickel tungsten alloy. In an alternate embodiment, the metal containing layer may be deposited as a tungsten interlayer followed by a nickel layer. The ratio of tungsten in the metal containing layer should include at least 5% tungsten, and no more than 30% tungsten. A 10% tungsten density is preferred. The metal containing layer may have a thickness ranging from 5 nm to 25 nm.

Following deposition of the metal containing layer, the entire structure is subjected to an annealing step including, but not limited to, rapid thermal annealing. During annealing, the deposited metal containing layer reacts with the semiconductor material of source region 106 forming silicide 124. A typical thermal anneal is completed at a temperature ranging from 300° C. to 600° C. for a time period ranging from 1 second to 90 seconds. Nickel is highly diffusive and begins to migrate into the semiconductor material quickly. Tungsten, on the other hand, diffuses slower and must generally be subjected to a temperature range from 800° C. or greater. The use of low concentrations of tungsten (e.g., no more than 30%) allows current processes for creating silicides to remain in use without substantial alteration. Following thermal anneal, the non-reacted portion of the metal containing layer is removed. This non-reacted portion of the metal containing layer may be removed by an etch process that is selective to silicide 124.

Due to the difference in diffusive properties between nickel and tungsten, nickel elements diffuse deeper and wider than tungsten. As a result, the relatively immobile tungsten elements remain in an upper portion of silicide 124. Silicide 124 may be described as a nickel-tungsten silicide with a tungsten rich surface, or a nickel silicide with a tungsten finish. The tungsten rich surface is defined as having greater than fifty percent (50%) of the deposited W in a surface region of the silicide. In a preferred embodiment, the surface region is no thicker than 20% of the entire thickness of the silicide. For example, in a Ni—W allow containing 10% W, the resulting silicide might contain 8% W (or 80% of the all deposited W) near or at the surface of the silicide, with the remaining 2% distributed within the bulk of the silicide.

In an alternate embodiment, a semiconductor containing material may be deposited on source region 106 prior to the metal containing layer.

The tungsten rich surface of silicide 124 helps with subsequent nucleation, contributes to better electrical contact with less resistance for a subsequent tungsten contact, and alleviates pre-cleaning requirements as less oxidation occurs on a tungsten surface as compared to a nickel-silicide surface.

Figure 5:
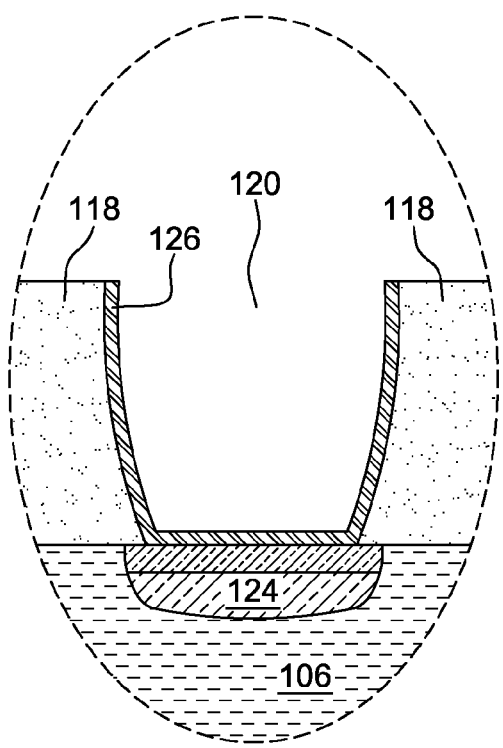
FIG. 5 depicts the formation of a tungsten nucleation layer over the silicide and a sidewall of the contact hole of FIG. 4, in accordance with an embodiment of the present invention.

FIG. 5 depicts the formation of a tungsten containing layer, in accordance with an embodiment of the present invention. Tungsten-containing layer 126 is a thin layer of tungsten containing material, generally on the order of 10-30 angstroms. Tungsten-containing layer 126 may be formed using any fluorine-free chemistry, which promotes sidewall adhesion and prevents a negative reaction with silicide 124.

In a preferred embodiment, tungsten-containing layer 126 is deposited by exposing contact hole 120 to a fluorine-free tungsten-containing organometallic precursor and a reduction agent. Tungsten-containing layer 126 may act as a nucleation layer or, alternatively, may act as a glue layer to which a nucleation layer is subsequently deposited on. Tungsten-containing layer 126 may be deposited by any appropriate method, including by simultaneously exposing contact hole 120 to the organometallic precursor and reducing agent in a chemical vapor deposition type process or by introducing alternating pulses of the organometallic precursor and reducing agent in an atomic layer deposition (ALD) or pulsed nucleation layer (PNL) type process. Reducing agents include but are not limited to hydrogen, ammonia, methane, ethane, ethylene, and silanes. In ALD type processes, the reducing agent may be activated (e.g., atomic hydrogen) or non-activated. Activated reducing agent species may be produced by direct or remote plasma generators, thermal crackers, etc. Ion-induced ALD (iALD) may be used. The deposited tungsten-containing layer 126 is generally a tungsten rich film. Acceptable compositions typically include tungsten (W), tungsten carbide (WC), tungsten carbonitride (WCN), tungsten nitride (WN), and combinations thereof.

The organometallic tungsten precursor is a halogen-free compound that may contain oxygen and nitrogen. Some examples of such compounds include but are not limited to tungsten hexacarbonyl, ethylcyclopentadienyl dicarbonyl nitrosyl tungsten, ethylcyclopentadienyl dihydrogen tricarbonyl, bis(tert-butylimino)bis(dimethylamino) tungsten. According to various embodiments, the precursor may be aliphatic or aryl, including any of alkyl, alkenyl, alkynyl and phenyl groups. The precursor may also have carbon and/or nitrogen, e.g., in the form of carbonyl, nitrosyl and amino groups.

In certain embodiments, the organometallic tungsten precursor may be introduced with a co-reactant, e.g., a carbon or nitrogen containing compound, to tune the composition of the deposited film. Also, in certain embodiments, non-organic compounds such as W(CO)6, as well as organic derivatives of W(CO)6 may be used. Importantly, the precursor used does not have a halogen (such as fluorine).

Tungsten-rich organometallic films (including W/WC films) have been shown to be continuous and have good adhesion at thicknesses between about 10-50 angstroms.

Figure 6:
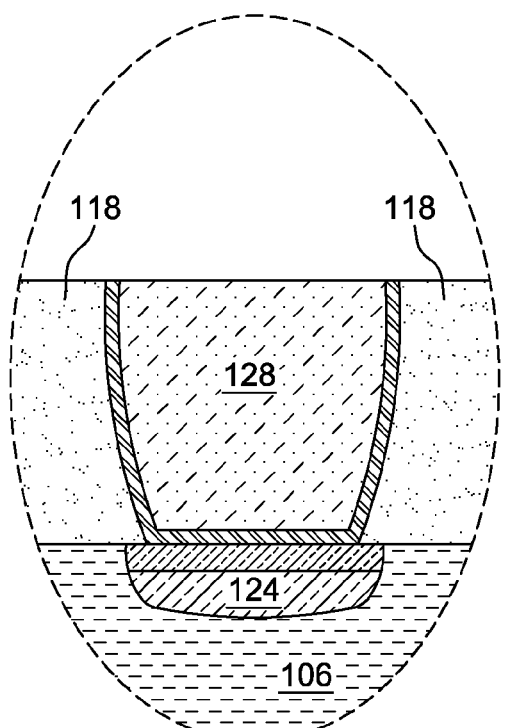
FIG. 6 depicts the formation of a tungsten contact within the contact hole of FIG. 4 and nucleation layer of FIG. 5, in accordance with an illustrative embodiment.

FIG. 6 depicts the formation of contact 128, in accordance with an illustrative embodiment. Contact 128 is comprised of tungsten and may be formed using traditional $WF_6$ reduction. Due to preferential nucleation on the tungsten rich surface of silicide 124, contact 128 is formed from the bottom up.

After forming contact 128 subsequent processing operations are performed, e.g., chemical mechanical planarization (CMP), etchback, or patterning.

Figure 7:
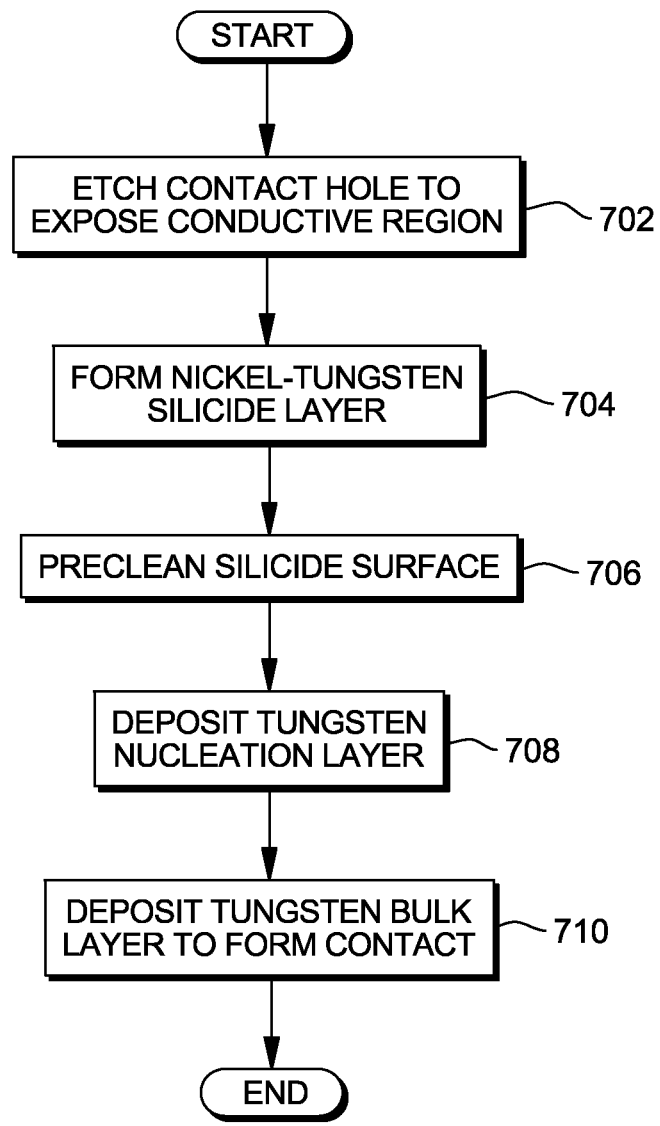
FIG. 7 depicts the steps of a flowchart for a process of depositing the tungsten contact.

FIG. 7 depicts the steps of a flowchart for a process of forming the liner-free tungsten contact, in accordance with an illustrative embodiment.

The first step in this exemplary process flow is to etch a contact hole through a dielectric layer to expose a conductive region (step 702). The contact hole may be a trench or may be a circular or oval hole. The conductive region is a conductive region of a semiconductor device such as a source or drain region of a FET. Subsequent to exposing the conductive region, a nickel-tungsten silicide layer is formed (step 704). In an alternate embodiment, the nickel-tungsten silicide layer is formed prior to the deposition of the dielectric layer and the contact hole is etched to expose the silicide layer. Using known silicidation processes, nickel and tungsten (preferably as a nickel-tungsten alloy) are diffused into a semiconductor containing material during an annealing process to form a silicide. Due to the high diffusive properties of nickel, nickel diffuses faster and farther than tungsten, leaving a tungsten rich surface on a surface of the nickel-tungsten silicide. Subsequent to the formation of the silicide, the surface is preferably cleaned (step 706). A tungsten nucleation layer is deposited within the contact hole and over the silicide (step 708). The nucleation layer is deposited by using fluorine-free tungsten containing precursors. In the preferred embodiment, the precursor is an organometallic tungsten containing precursor. A tungsten bulk layer is deposited within the contact hole and nucleation layer to form the contact (step 710). The tungsten bulk layer may be deposited using traditional deposition techniques, such as a tungsten hexafluoride reduction.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a method for forming a liner free tungsten contact and the resulting structure (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for forming a liner-free tungsten contact, the method comprising the steps of:
    forming a silicide on a conductive region of a semiconductor substrate, the silicide utilizing at least nickel and tungsten, wherein the silicide is formed by depositing a metal layer comprising nickel and tungsten on the conductive region, and performing a thermal annealing process to form the silicide from the metal layer;
    forming a dielectric layer on the semiconductor substrate and etching an opening through the dielectric layer over the conductive region;
    depositing a tungsten-containing layer on a sidewall of the opening and on the silicide on the conductive region by exposing the sidewall and the silicide to a non-halogen (fluorine-free) organometallic tungsten precursor and a reducing agent thereby depositing a tungsten-containing film on the silicide and at least a portion of the sidewall, wherein the tungsten-containing layer is formed utilizing fluorine-free materials, wherein the tungsten in the tungsten-containing layer makes up at least five atomic percent (5 at. %) of the tungsten-containing layer and no more than thirty atomic percent (30 at. %) of the tungsten-containing layer; and
    filling the opening with bulk tungsten to form a contact.

2. The method of claim 1, wherein the step of forming the dielectric layer on the semiconductor substrate occurs prior to the step of forming the silicide on the conductive region and the step of forming the silicide on the conductive region occurs after the step of etching the opening through the dielectric layer over the conductive region.

3. The method of claim 1, wherein the tungsten-containing layer acts as a nucleation layer for the bulk tungsten.

4. The method of claim 1, further comprising forming a nucleation layer on the tungsten-containing layer prior to filling the opening with bulk tungsten.

5. The method of claim 1, wherein the opening through the dielectric layer is one of a circular contact hole, an oval shaped contact hole, or a trench.

6. The method of claim 1, wherein the conductive region is a source region or a drain region of a transistor.

7. The method of claim 1, wherein the metal layer comprises a nickel-tungsten alloy.

8. The method of claim 1, wherein the metal layer comprises a first region comprising tungsten and a second region-comprising nickel, wherein the first region and the second region are, at least in part, substantially coplanar.

9. The method of claim 1, wherein the thermal annealing process produces a tungsten-rich region at a surface of the silicide.

10. The method of claim 9, wherein a thickness of the tungsten-rich region is less than or equal to about twenty percent (20%) of a thickness of the silicide and a composition of the tungsten-rich region comprises at least fifty percent (50%) of the total tungsten contained in the silicide.

11. The method of claim 1, wherein the step of depositing the tungsten-containing layer on the sidewall of the opening and on the silicide comprises the step of exposing the sidewall and the silicide to a fluorine-free tungsten-containing precursor to form a tungsten-containing film on the silicide and at least a portion of the sidewall.

12. The method of claim 1, wherein the tungsten-containing layer comprises one or more of tungsten carbide, tungsten carbonitride, and tungsten nitride.

13. A method for forming a liner-free tungsten contact, the method comprising the steps of:
   providing a semiconductor substrate with a conductive region;
   forming a dielectric layer overlying the semiconductor substrate;
   etching an opening through the dielectric layer to expose the conductive region;
   forming a silicide on an exposed portion of the conductive region utilizing at least nickel and tungsten, wherein the silicide is formed by depositing a silicon-containing material on the exposed portion of the conductive region, depositing a metal layer comprising nickel and tungsten on the conductive region, and performing a thermal annealing process to form the silicide from the metal layer;
   depositing a tungsten-containing layer on a sidewall of the opening and on the silicide, by exposing the sidewall and the silicide to a non-halogen (fluorine-free) organometallic tungsten precursor and a reducing agent thereby depositing a tungsten-containing film on the silicide and at least a portion of the sidewall wherein the tungsten-containing layer is formed utilizing fluorine-free materials, wherein the tungsten contained in the tungsten-containing layer makes up at least five atomic percent (5 at. %) of the tungsten-containing layer and no more than thirty atomic percent (30 at. %) of the tungsten-containing layer; and
   filling the opening with bulk tungsten to form the contact.

14. The method of claim 13, wherein the silicon-containing material is deposited conformally on the exposed portion of the conductive region and at least a portion of a sidewall of the opening through the dielectric layer and wherein the formed silicide covers the exposed portion of the conductive region and at least the portion of the sidewall of the opening through the dielectric layer.

15. The method of claim 13, wherein the silicide comprises a tungsten-rich region at a surface of the silicide and a thickness of the tungsten-rich region is less than or equal to about twenty percent (20%) of a thickness of the silicide and a composition of the tungsten-rich region comprises at least fifty percent (50%) of the total tungsten contained in the silicide.

* * * * *